United States Patent
Yang et al.

[11] Patent Number: 5,920,791
[45] Date of Patent: Jul. 6, 1999

[54] METHOD OF MANUFACTURING INTERMETAL DIELECTRICS FOR SUB-HALF-MICRON SEMICONDUCTOR DEVICES

[75] Inventors: Fu-Liang Yang; Tony Chang, both of Hsin-Chu, Taiwan

[73] Assignee: Vanguard International Semiconductor Corporation, Hsin-Chu, Taiwan

[21] Appl. No.: 08/965,318

[22] Filed: Nov. 6, 1997

[51] Int. Cl.[6] .............................. H01L 21/38; H01L 21/31
[52] U.S. Cl. .................... 438/622; 438/624; 438/631; 438/706
[58] Field of Search ...................... 438/622, 624, 438/631, 645, 697, 699, 706, 713

[56] References Cited

U.S. PATENT DOCUMENTS

| | | | |
|---|---|---|---|
| 5,098,865 | 3/1992 | Machado et al. | 438/788 |
| 5,270,264 | 12/1993 | Andideh et al. | 437/228 |
| 5,275,977 | 1/1994 | Otsubo et al. | 437/235 |
| 5,294,294 | 3/1994 | Namose | 156/643 |
| 5,302,233 | 4/1994 | Kim et al. | 438/692 |
| 5,334,552 | 8/1994 | Homma | 437/195 |
| 5,354,715 | 10/1994 | Wang et al. | 437/228 |
| 5,382,547 | 1/1995 | Sultan et al. | 438/624 |
| 5,393,708 | 2/1995 | Hsia et al. | 437/228 |
| 5,426,076 | 6/1995 | Moghadam | 437/228 |
| 5,429,995 | 7/1995 | Nishiyama et al. | 437/238 |
| 5,459,105 | 10/1995 | Matsuura | 437/228 |
| 5,627,104 | 5/1997 | Bryant et al. | 438/631 |
| 5,641,712 | 6/1997 | Grivna et al. | 438/624 |
| 5,789,314 | 8/1998 | Yen et al. | 438/622 |

OTHER PUBLICATIONS

Hayasaka et al. "High–Quality and Low Dielectric Constant $SiO_2$ CVD using High Density Plasma", 1993 Dry Process Symposium, pp. 163–168.

*Primary Examiner*—T. N. Quach
*Attorney, Agent, or Firm*—George O. Saile; Stephen B. Ackerman; Rosemary L. S. Pike

[57] ABSTRACT

A method of gap filling in the intermetal dielectric layer is described. Semiconductor device structures are provided in and on a semiconductor substrate and covered with an insulating layer. A conducting layer is deposited overlying the insulating layer and patterned wherein a gap is formed between portions of the patterned conducting layer. In a deposition chamber, the following steps are repeated until the gap is completely filled: a) depositing an oxide layer over the patterned conducting layer wherein an oxide overhang is formed on either side of the gap, and b) etching away the oxide overhang. The second conducting layer may now be deposited and patterned completing the fabrication of the integrated circuit device.

19 Claims, 2 Drawing Sheets

METHOD OF MANUFACTURING INTERMETAL DIELECTRICS FOR SUB-HALF-MICRON SEMICONDUCTOR DEVICES

BACKGROUND OF THE INVENTION (1) Field of the Invention

The present invention relates to the fabrication of integrated circuit devices, and more particularly, to a method of improving the gap filling characteristics of an intermetal dielectric layer for sub-half-micron semiconductor devices in the fabrication of integrated circuits.

(2) Description of the Prior Art

In the fabrication of integrated circuit devices, semiconductor device structures such as gate electrodes and source and drain regions are typically formed in and on a semiconductor substrate. An insulating layer is deposited over the surface of the substrate and planarized. Next, a first metal conducting layer is deposited and patterned to form metal lines. An intermetal dielectric layer is deposited overlying the metal lines. A second metal layer will then be deposited and patterned. Further layers of metallization may be formed. As the size of semiconductor devices decreases to the sub-half-micron regime, the size of the gap between the patterned metal areas decreases. This leads to stringent requirements for the manufacturing of intermetal dielectrics, including: 1) voidless filling of narrow gaps between metal conductors, 2) a planar surface for successful patterning and etching of the next blanket metal deposition, and 3) freedom from spin-on-glass poison via problems.

Many workers in the field have attempted to meet these difficult intermetal dielectric requirements. Many of the previous inventions make use of $O_3$-TEOS (ozone-tetraethoxysilane) or HDP-CVD (high density plasma chemical vapor deposition) silicon oxide. These techniques have problems of either low throughput or the need of chemical mechanical polishing (CMP) for surface planarity. For example, U.S. Pat. No. 5,393,708 to Hsia et al uses $O_3$-TEOS to fill trenches in the layer structure and etches back the $O_3$-TEOS to leave it only within the trenches. U.S. Pat. No. 5,354,715 to Wang et al teaches $O_3$-TEOS as a gap-filling material and in-situ etchback for planarization. U.S. Pat. No. 5,426,076 to Moghadam teaches deposition of a second layer of silicon oxide to fill gaps and then etchback of the silicon oxide to remove it from all regions except within the gaps. U.S. Pat. No. 5,459,105 to Matsuura teaches a planarization method where multiple oxide layers are formed over a metal pattern and then etched back. U.S. Pat. No. 5,270,264 to Andideh et al teaches gap filling including a noble gas sputter etching and redeposition of the etched material in the gaps.

Other methods use a fluorine-doped gap-filling layer. U.S. Pat. No. 5,429,995 to Nishiyama et al teach gap filling using a film formed by source gases containing silicon, oxygen, and fluorine. U.S. Pat. No. 5,334,552 to Homma teaches depositing a fluorine-containing silicon oxide film followed by a resist or spin-on-glass film and etching back both films. The paper, "High-Quality and Low Dielectric Constant SiO2 CVD Using High Density Plasma" by N. Hayasaka et al, 1993 *Dry Process Symposium*, discusses forming a high quality fluorine-doped silicon oxide film. U.S. Pat. No. 5,275,977 to Otsubo et al teaches the use of a fluorine compound in the deposition of a silicon oxide film and simultaneous etching of the film. U.S. Pat. No. 5,294,294 to Namose teaches an oxide etching method using a fluorine gas and an inert gas.

SUMMARY OF THE INVENTION

Accordingly, a primary object of the invention is to provide a process for improving the gap filling characteristics of an intermetal dielectric layer in the fabrication of integrated circuit devices.

A further object of the invention is to provide a process for improving the gap filling characteristics of an intermetal dielectric layer for sub-half-micron semiconductor devices.

Another object is to provide a gap-filling intermetal dielectric layer without the need for further planarization.

In accordance with the objects of the invention, an improved method of gap filling in the intermetal dielectric layer is achieved. Semiconductor device structures are provided in and on a semiconductor substrate and covered with an insulating layer. A conducting layer is deposited overlying the insulating layer and patterned wherein a gap is formed between portions of the patterned conducting layer. In a deposition chamber, the following steps are repeated until the gap is completely filled: a) depositing an oxide layer over the patterned conducting layer wherein an oxide overhang is formed on either side of the gap, and b) etching away the oxide overhang. The second conducting layer may now be deposited and patterned completing the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
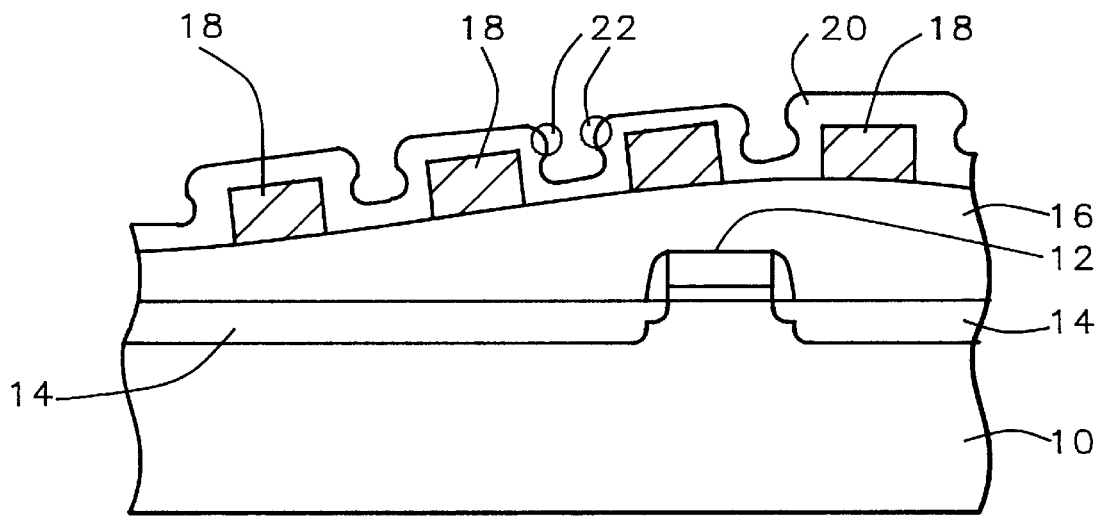
FIGS. 1–4 are cross-sectional representations of a preferred embodiment of the present invention.

Referring now more particularly to FIG. 1, there is shown a semiconductor substrate 10, in which may be formed semiconductor device structures which may include polysilicon gate electrodes 12 and source and drain regions 14, as shown. An insulating layer 16 is formed overlying the semiconductor device structures. A layer of conducting material, such as aluminum or an aluminum alloy, has been deposited over the planarized surface of the semiconductor substrate and patterned to form metal lines 18. The gap between two of the metal lines 18 may be as small as between about 0.1 to 0.5 microns.

The intermetal dielectric layer will now be formed according to the following process. The semiconductor wafer is moved into a deposition chamber in which a temperature of between about 350 and 450° C. is maintained along with a pressure of between about 0.1 and 15 Torr and power of between about 100 and 500 watts. The oxide layer 20 is deposited under plasma enhanced chemical vapor deposition (PECVD) using the following parameters. $SiH_4$ is flowed at a rate of between about 10 and 200 sccm and $N_2O$ is flowed at a rate of 500 to 5000 sccm. The oxide is deposited to a thickness of between about 500 and 3000 Angstroms.

Figure 2:
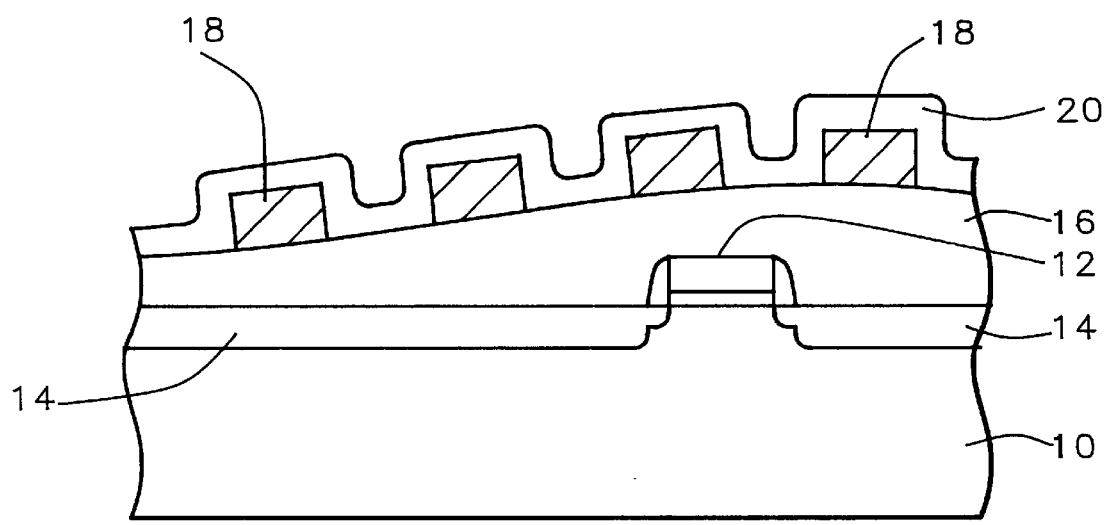

While the wafer is still within the deposition chamber, $SiH_4$ and $N_2O$ gas flow is stopped. $CF_4$ or $C_2F_6$ gas is flowed at a rate of between about 100 to 1000 sccm. The $CF_4$ or $C_2F_6$ gas will etch away the oxide overhang areas 22. A low pressure of between about 0.1 to 1 Torr is required during etching. A higher pressure will result in isotropic etching which is not desired. All other parameters are the same as during deposition. Etching continues for between about 5 to 150 seconds. FIG. 2 illustrates the oxide layer 20 after the etching.

Figure 3:
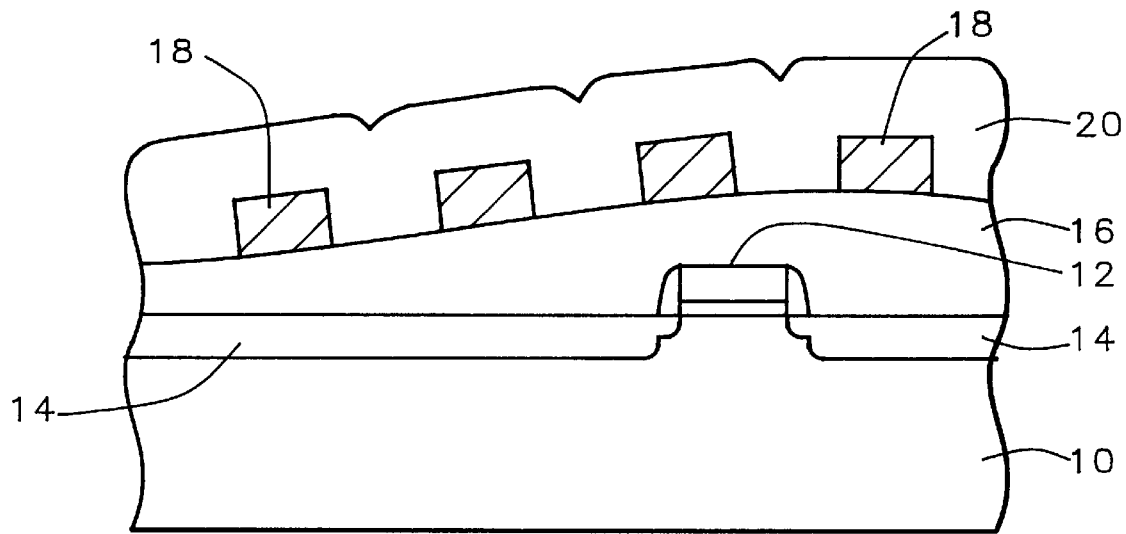

The $CF_4$ or $C_2F_6$ gas flow is shut off and the oxide deposition gases, $SiH_4$ and $N_2O$, are flowed again to continue filling the gaps. The oxide deposition and overhang etching steps are repeated to completely fill the gaps between the metal lines, as shown in FIG. 3. The final intermetal dielectric layer 20 will have a thickness of between about 500 and 3000 Angstroms.

The top surface of the intermetal dielectric layer 20 is substantially planar. If desired, the surface may be planarized further by CMP or by spin-on-glass deposition and etchback. However, this step is optional.

Figure 4:
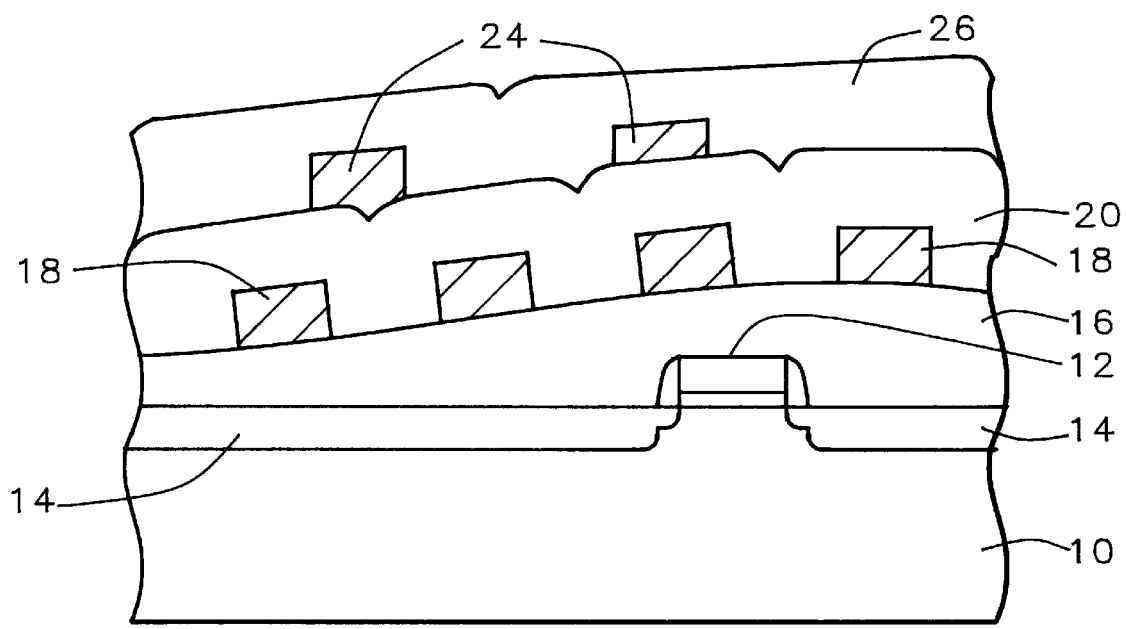

Referring now to FIG. 4, a second metal layer is deposited and patterned to form the second level metallization 24. The process of the invention may now be used again to form a second intermetal dielectric layer 26.

The process of the present invention comprises alternating steps of silicon oxide deposition and etching with a fluorine-containing plasma to etch away the overhang between gaps. The process of the invention results in a voidless filling of narrow gaps between metal conductors in the fabrication of integrated circuit devices having semiconductor device structures in the sub-half-micron range. The surface of the intermetal dielectric layer formed by the process of the present invention is planar for successful patterning and etching of the next level metallization.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:

providing semiconductor device structures in and on a semiconductor substrate and covering said semiconductor device structures with an insulating layer;

depositing a conducting layer overlying said insulating layer and patterning said conducting layer wherein a gap is formed between portions of said patterned conducting layer;

repeating the steps of:
 a) depositing a $SiH_4$-based oxide layer over said patterned conducting layer wherein an oxide overhang is formed on either side of said gap; and
 b) non-isotropically etching away said oxide overhang;

until said gap is completely filled with said oxide layer; and completing the fabrication of said integrated circuit device.

2. A method according to claim 1 wherein said gap is between about 0.1 and 0.5 microns wide.

3. A method according to claim 1 wherein said step of depositing said oxide layer comprises flowing $SiH_4$ gas at a rate of between about 10 and 200 sccm and flowing $N_2O$ gas at a rate of between about 500 and 5000 sccm at a temperature of between about 350 and 450° C. at a pressure of between about 0.1 and 15 Torr and a power of between about 100 and 500 watts.

4. A method according to claim 1 wherein said step of etching away said oxide overhang comprises flowing $CF_4$ gas at a rate of between about 100 and 1000 sccm at a pressure of 0.1 to 1 Torr and power of 100 to 500 watts.

5. A method according to claim 1 wherein said step of etching away said oxide overhang comprises flowing $C_2F_6$ gas at a rate of between about 100 and 1000 sccm at a pressure of 0.1 to 1 Torr and power of 100 to 500 watts.

6. A method according to claim 1 wherein said oxide layer has a final thickness of between about 1000 and 5000 Angstroms.

7. A method of manufacturing an integrated circuit device comprising:

providing semiconductor device structures in and on a semiconductor substrate and covering said semiconductor device structures with an insulating layer;

depositing a conducting layer overlying said insulating layer and patterning said conducting layer wherein a gap is formed between portions of said patterned conducting layer;

in a deposition chamber, repeating the steps of:
 a) depositing a $SiH_4$-based oxide layer over said patterned conducting layer wherein an oxide overhang is formed on either side of said gap; and
 b) non-isotropically etching away said oxide overhang using a fluorine-containing gas;

until said gap is completely filled with said oxide layer; and completing the fabrication of said integrated circuit device.

8. A method according to claim 7 wherein said gap is between about 0.1 and 0.5 microns wide.

9. A method according to claim 7 wherein said step of depositing said oxide layer comprises flowing $SiH_4$ gas at a rate of between about 10 and 200 sccm and flowing $N_2O$ gas at a rate of between about 500 and 5000 sccm at a temperature of between about 350 and 450° C. at a pressure of between about 0.1 and 15 Torr and a power of between about 100 and 500 watts.

10. A method according to claim 7 wherein said fluorine-containing gas is $CF_4$ gas and wherein said $CF_4$ gas is flowed at a rate of between about 100 and 1000 sccm at a pressure of 0.1 to 1 Torr and power of 100 to 500 watts.

11. A method according to claim 7 wherein said fluorine-containing gas is $C_2F_6$ gas and wherein said $C_2F_6$ gas is flowed at a rate of between about 100 and 1000 sccm at a pressure of 0.1 to 1 Torr and power of 100 to 500 watts.

12. A method according to claim 7 wherein said oxide layer has a final thickness of between about 1000 and 5000 Angstroms.

13. A method of manufacturing an integrated circuit device comprising:

providing semiconductor device structures in and on a semiconductor substrate and covering said semiconductor device structures with an insulating layer;

depositing a first metal layer overlying said insulating layer and patterning said first metal layer wherein a gap is formed between portions of said patterned first metal layer;

depositing a $SiH_4$-based oxide layer over said patterned first metal layer wherein an oxide overhang is formed on either side of said gap;

thereafter non-isotropically etching away said oxide overhang using a fluorine-containing gas;

repeating said step of depositing said oxide layer and thereafter said step of etching away said oxide overhang until said gap is completely filled with said oxide layer;

thereafter depositing a second metal layer overlying said oxide layer and patterning said second metal layer; and completing the fabrication of said integrated circuit device.

14. A method according to claim 13 wherein said gap is between about 0.1 and 0.5 microns wide.

15. A method according to claim 13 wherein said step of depositing said oxide layer comprises flowing $SiH_4$ gas at a rate of between about 10 and 200 sccm and flowing $N_2O$ gas at a rate of between about 500 and 5000 sccm at a temperature of between about 350 and 450° C. at a pressure of between about 0.1 and 15 Torr and a power of between about 100 and 500 watts.

16. A method according to claim 13 wherein said step of depositing said oxide layer is performed in a deposition chamber and said step of etching away said oxide overhang is performed in same said deposition chamber.

17. A method according to claim 13 wherein said fluorine-containing gas is $CF_4$ gas and wherein said $CF_4$ gas is flowed at a rate of between about 100 and 1000 sccm at a pressure of 0.1 to 1 Torr and power of 100 to 500 watts.

18. A method according to claim 13 wherein said fluorine-containing gas is $C_2F_6$ gas and wherein said $C_2F_6$ gas is flowed at a rate of between about 100 and 1000 sccm at a pressure of 0.1 to 1 Torr and power of 100 to 500 watts.

19. A method according to claim 13 wherein said oxide layer has a final thickness of between about 1000 and 5000 Angstroms.

* * * * *